United States Patent
Ohkawa

(10) Patent No.: US 6,888,404 B2
(45) Date of Patent: May 3, 2005

(54) MULTICARRIER AMPLIFYING DEVICE

(75) Inventor: Shigeru Ohkawa, Sapporo (JP)

(73) Assignee: Fujitsu Limited, Kawasaki (JP)

(*) Notice: Subject to any disclaimer, the term of this patent is extended or adjusted under 35 U.S.C. 154(b) by 347 days.

(21) Appl. No.: 10/319,931

(22) Filed: Dec. 12, 2002

(65) Prior Publication Data

US 2003/0090319 A1 May 15, 2003

Related U.S. Application Data

(63) Continuation of application No. PCT/JP00/03951, filed on Jun. 16, 2000.

(51) Int. Cl.$^7$ ............................................. H03F 3/66
(52) U.S. Cl. ........................................ 330/52; 330/151
(58) Field of Search .......................... 330/52, 149, 151

(56) References Cited

U.S. PATENT DOCUMENTS

| | | | |
|---|---|---|---|
| 5,493,252 A | 2/1996 | Takai | |
| 5,530,920 A | 6/1996 | Takeda | |
| 5,694,395 A | 12/1997 | Myer et al. | |
| 5,790,555 A | 8/1998 | Narahashi et al. | |
| 5,815,036 A | * 9/1998 | Yoshikawa et al. | 330/52 |
| 6,148,185 A | 11/2000 | Maruyama et al. | |
| 2001/0015673 A1 | * 8/2001 | Yamashita et al. | 330/52 |

FOREIGN PATENT DOCUMENTS

| | | |
|---|---|---|
| GB | 2 318 938 | 5/1998 |
| JP | 3-254236 | 11/1991 |
| JP | 2945451 | 3/1992 |
| JP | 5-130055 | 5/1993 |
| JP | 5-268178 | 10/1993 |
| JP | 5-335841 | 12/1993 |
| JP | 06-132835 | 5/1994 |
| JP | 7-147547 | 6/1995 |
| JP | 7-283743 | 10/1995 |
| JP | 8-125576 | 5/1996 |
| JP | 8-274734 | 10/1996 |
| JP | 9-8560 | 1/1997 |
| JP | 9-153828 | 6/1997 |
| JP | 10-190361 | 7/1998 |
| JP | 2945447 | 6/1999 |
| JP | 11-154828 | 6/1999 |
| JP | 11-205162 | 7/1999 |
| WO | 96/18249 | 6/1996 |

* cited by examiner

*Primary Examiner*—Steven J. Mottola
(74) *Attorney, Agent, or Firm*—Katten Muchin Zavis Rosenman

(57) ABSTRACT

In a multicarrier amplifying device, a power detecting section of a variable frequency type changes a detection frequency according to a carrier frequency, a power of which is to be measured, to detect a power level of each carrier, and a controlling section automatically adjusts the power level of the carrier on the basis of the detected power level. It is possible to automatically set a transmission power level of one carrier to a specified power level without stopping existing carriers.

3 Claims, 4 Drawing Sheets

MULTICARRIER AMPLIFYING DEVICE

This a continuation of PCT/JP00/03951 filed Jun. 16, 2000.

TECHNICAL FIELD

The present invention relates to a multicarrier amplifying device amplifying a signal having a plurality of carriers differing from one another, in common with the carriers. The present invention relates to an amplifying device, for example, suitable for use in a base station in a mobile communication network.

BACKGROUND ART

FIG. 4 is a block diagram showing an example of known multicarrier feed-forward amplifiers. A multicarrier feed-forward amplifier 100 (hereinafter referred simply as "multicarrier amplifier 100") shown in FIG. 4 amplifies a main signal having a plurality of carrier signals at frequencies (RF (Radio Frequency)) differing from one another, in common with the carriers, while compensating a distortion component (harmonic component) generated in the main signal due to the amplification.

As shown in FIG. 4, the multicarrier amplifier 100 comprises, for example, a main signal canceling unit 100A having a first branch circuit 101, a first variable attenuator 102, a first variable phase shifter 103, a pilot oscillator 104, a first combining circuit 105, a main signal amplifier (HPA: High Power Amplifier) 106, a second branch circuit 107, an attenuator 108, a first delay line 109 and a second combining circuit 110, a distortion canceling unit 100b having a second variable attenuator 111, a second variable phase shifter 112, an auxiliary amplifier 113, a second delay line 114 and a third combining circuit 115, along with third and fourth branch circuits 116 and 117, a local oscillator for frequency conversion 118, a frequency converter 119, a band-pass filter (BPF: Band Pass Filter) 120, a received signal strength indicator (RSSI; Received Signal Strength Indicator) for a pilot signal 121, a received signal strength indicator (RSSI) for all carrier signals 122, and a control unit 123.

In the main signal canceling unit (distortion extracting unit) 110A, the first branch circuit 101 takes out a part of an input signal having a plurality of carriers (for example, frequencies $f_{RF1}-f_{RFn}$; n being an integer not less than two) and outputs it acting as an auxiliary signal for canceling a main signal to the delay line 109, besides outputting the remaining input signal acting as the main signal to the variable attenuator 102. The variable attenuator 102 and the variable phase shifter 103 invert and adjust the phase of the main signal according to control information from the control unit 123 so that the main signal from the above first branch circuit 101 is combined by the second combining circuit 110 at the same level as the auxiliary signal and in the oppposite phase to that of the auxiliary signal.

The pilot oscillator 104 generates a pilot signal having a predetermined frequency $f_p$. The first synthesizing circuit 105 combines the main signal, the phase and level of which have been adjusted, and the pilot signal from the pilot oscillator 104, thereby adding the pilot signal to the main signal. The main signal amplifier 106 amplifies the main signal, to which the pilot signal has been added as above, in common with the carriers.

The second branch circuit 107 branches an output of the above main signal amplifier 106 into two signals, one which is outputted as an output of the multicarrier amplifier, the other of which is outputted as a signal to be combined with the above auxiliary signal. The attenuator 108 attenuates the level of the signal from the branch circuit 107 to a level before being amplified by the main signal amplifier 106.

The second combining circuit 110 combines a signal (the phase of which has been inverted by the variable phase shifter 102) from the attenuator 108 and the above auxiliary signal taken out by the first branch circuit 101, thereby canceling a main signal component in a signal from the second branch circuit 107. As a result, only a distortion component generated in an amplified output (main signal) due to the linear characteristic of the main signal amplifier 106 is detected. The delay line 109 delays the above auxiliary signal by a predetermined time so that the timing of the auxiliary signal and the timing of a signal from the second branch circuit 107 are matched in the second combining circuit 110 when they are combined.

In the distortion canceling unit 100b, the variable attenuator 11 and the variable phase shifter 112 adjust the level and phase of the distortion component generated in an output of the main signal amplifier 106 using the distortion component detected by the main signal canceling unit 100a (second combining circuit 110) as above according to control information from the control unit 123 in order to cancel the distortion component. The auxiliary amplifier (distortion signal amplifier) 113 amplifies the gain of the distortion component, the level and phase of which have been adjusted, and obtains a gain necessary to cancel the distortion of the main signal in the third combining circuit 115.

The third combining circuit 115 combines an output of the main signal amplifier 106 and an output of the auxiliary amplifier 113, thereby canceling the distortion component generated in the output of the main signal amplifier 106. Each of the third and fourth branch circuit 116 and 117 takes out a part of the main signal in which the distortion component has been canceled. A part of the main signal taken out by the third branch circuit 116 is outputted to the frequency converter 119. A part of the main signal taken out by the fourth branch circuit 117 is outputted to the received signal strength indicator 122.

The local oscillator 118 fixedly generates a frequency signal in IF (Intermediate Frequency) band. The frequency converter 119 converts (down-converts) the main signal in RF band from the third branch circuit 116 to a frequency signal in IF band using the frequency signal from the local oscillator 118. The BPF 120 allows only a pilot frequency component of the main signal down-converted as above to pass therethrough to extract a pilot signal from the main signal. The above down-converting process is performed mainly to relief the band-pass (cut-off) characteristic that the BPF 120 is required.

The received signal strength indicator 121 for a pilot signal detects a received signal strength of the pilot signal obtained by the above BPF 120, thereby to detect a power level of the pilot signal. Namely, part comprising the local oscillator 118, the frequency converter 119, the BPF 120 and the received signal strength indicator 121 forms a pilot power detecting unit 124 exclusive to the pilot signal.

Incidentally, the received signal strength indicator 122 for all carriers detects the received signal strength, not of each carrier but collectively, of the main signal taken out by the above fourth branch circuit 117, thereby detecting a total power level of the main signal.

The control unit 123 controls each of the variable attenuators 102 and 111, and the variable phase shifters 103 and 112 on the basis of a power level detected by the received signal strength indicator 121 for a pilot signal to adaptively control a distortion canceling (compensating) operation so that the distortion component of the main signal to be finally outputted become minimum. On the other hand, the control unit 123 monitors whether the total power level of the carriers detected by the received signal strength indicator 122 for all carriers exceeds a predetermined threshold value or not. When the total power level exceeds a predetermined over-output threshold value, the control unit 123 controls to disconnect (shutdown) the power supply in order to protect the device. Incidentally, the control unit 123 is configured with, for example, a CPU (Central Processing Unit) or the like.

In the known multicarrier amplifier 100 with the above structure, an output of the main signal amplifier 106 and an auxiliary signal taken out by the first branch circuit 101 are combined at the same level and in opposite phases in the second combining circuit 110 of the main signal canceling unit 100*a*, a main signal component is canceled in an output of the main signal amplifier 106, a distortion component is extracted, the distortion component and the output of the main signal amplifier 106 are combined at the same level and in the opposite phases in the combining circuit 115 of the distortion canceling unit 100*b*, whereby the distortion component of the main signal is canceled.

The known multicarrier amplifier 100 can measure a total power of the carriers by the received signal strength indicator 122, but it is very difficult for the multicarrier amplifier 100 to measure each carrier power. In order to confirm a carrier power level of one wave, it is necessary to stop other carriers or use an expensive, exclusive spectrum analyzer (device that can evaluate a channel power), for example.

When it becomes necessary to increase the number of carriers in order to cope with an increase in subscribers, the present condition in, for example, a multicarrier amplifier 100 used in a transmission system of a mobile communication base station in CDMA (Code Division Multiple Access) system is that it is necessary to stop all existing carriers and to stop services under operation, and manually adjust a power of an increased carrier (new or added carrier) while confirming it.

Particularly, in CDMA system, when the carrier transmission power of one wave is extremely large, interference of this wave to other carriers becomes large. For this, there is a severe requirement to adjust an increased carrier to a specified power, thus manual adjustment of the power level requires great human labor.

In the light of the above problem, an object of the present invention is to provide a multicarrier amplifying device which can detect each carrier power and automatically adjust the power level of each carrier without stopping services under operation and without using any special device such as a spectrum analyzer or the like.

DISCLOSURE OF INVENTION

To accomplish the above object, the present invention provides a multicarrier amplifying device comprising an amplifying means for amplifying a main signal having a plurality of carrier signals at frequencies differing from one another, a power detecting means of a variable frequency type being able to detect a power of an output of the amplifying means at an arbitrary detection frequency, and a controlling means for controlling the detection frequency in the power detecting means to a carrier detection frequency corresponding to a target carrier frequency, a power of which is to be measured, and controlling a power level of the carrier signal on the basis of a result of power detection by the power detecting means.

The multicarrier amplifying device with the above structure according to this invention changes the detection frequency in the power detecting means of a variable frequency type corresponding to a target carrier frequency to be measured, measures a power level of each carrier signal, and controls the power level of each carrier signal according to it.

Accordingly, it is possible to automatically adjust the power level of each carrier without stopping the services in operation, and without using a special apparatus such as a spectrum analyzer or the like, and largely reduce human labor for power level adjustment.

When a result of power detection on a pilot signal is used in a distortion compensation control on an amplified output of the amplifying means, this multicarrier amplifying device lets the power detecting means of a variable frequency type cope with not only a carrier frequency but also a pilot frequency, so that power detection on each carrier signal and power detection on the pilot signal are both possible in the common power detecting circuit. It is therefore possible to largely reduce the size of the device, and realize a small-sized amplifying device.

The above controlling means may further comprise an over-output state control unit for determining a total of results of power detection on all carrier signals obtained by repetitively executing the carrier detection mode on the all carrier signals, and determining and controlling an over-output state of the amplified output on the basis of the total. Whereby, it is possible to detect the over-output state of the total power level of all the carrier signals, and execute a control (power supply shutdown or the like for device protection) according to it. Thus, it becomes possible to secure the safety of the device, while largely reducing the size of the device.

BEST MODE FOR CARRYING OUT THE INVENTION

Hereinafter, description will be made of an embodiment of this invention with reference to the drawings.

Figure 1:
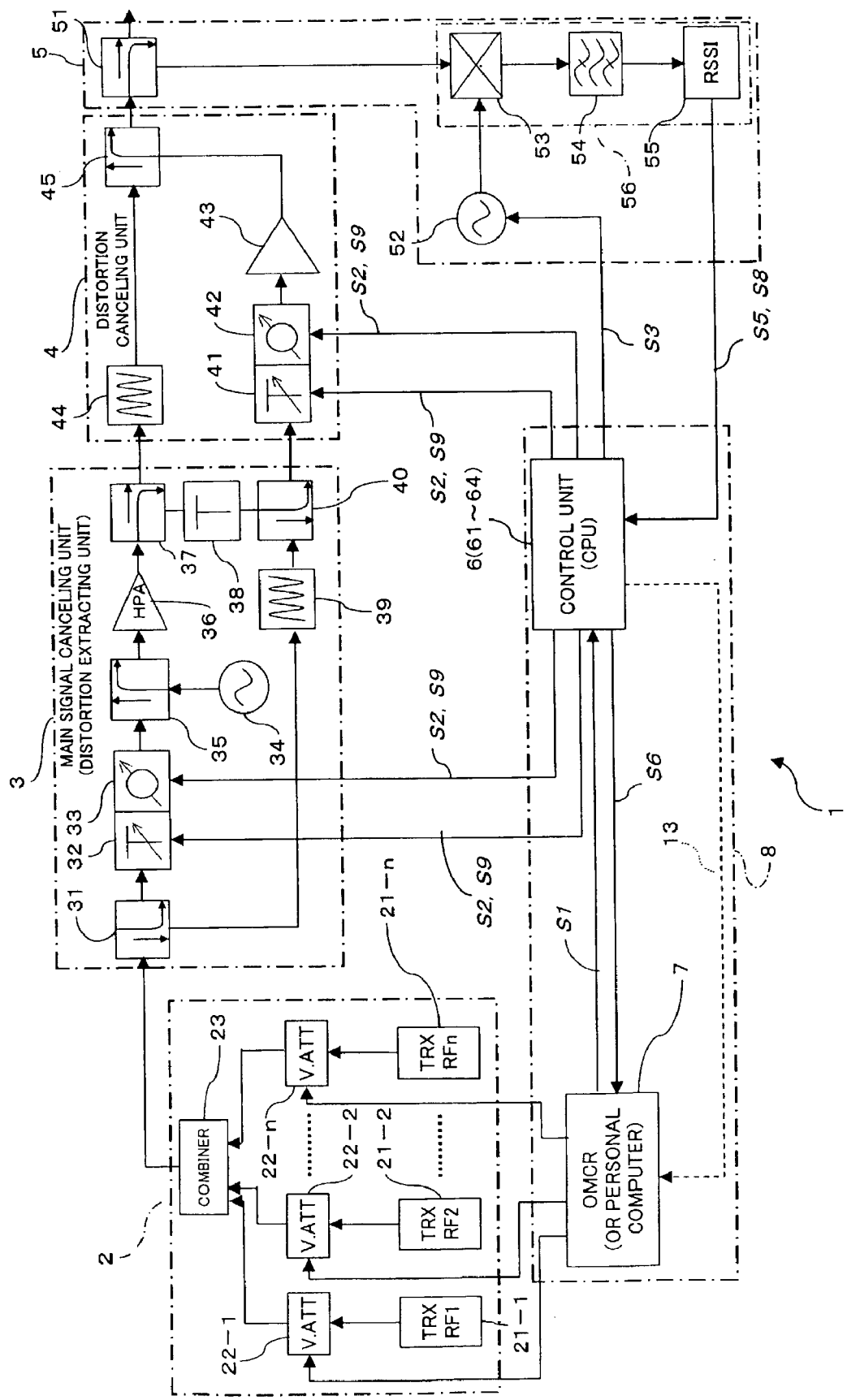
FIG. 1 is a block diagram showing a structure of a multicarrier feed-forward amplifier (multicarrier amplifying device) according to an embodiment of this invention.

FIG. 1 is a block diagram showing a structure of a multicarrier feed-forward amplifier (multicarrier amplifying device) according to an embodiment of this invention. A multicarrier feed-forward amplifier 1 (hereinafter simply referred as "a multicarrier amplifier 1") shown in FIG. 1 comprises a carrier generating unit 2, a main signal canceling unit 3, a distortion canceling unit 4, a power detecting unit 5 of a variable frequency type, a control unit (CPU) 6 and a centralized management system 7(a personal computer or the like). Incidentally, this multicarrier amplifier 1 is used in a transmission system of a mobile communication base station in CDMA system, for example.

The carrier generating unit 2 generates a plurality of carrier signals (RF1–RFn) (where n is an integer not less than two) at RF frequencies ($f_{RF1}-f_{RFn}$) differing from one another. For this purpose, the carrier generating unit 2 comprises transmitting circuits (TRX) 21-1 through 21-n provided for respective carrier signals (hereinafter referred simply as carriers), variable attenuators (VATT: Variable ATTenuator) 22-1 through 22-n for adjusting transmission power levels of carriers generated in the transmitting circuits 21-1 through 21-n, respectively, and a combiner 23 for combining generated carriers.

Figure 4:
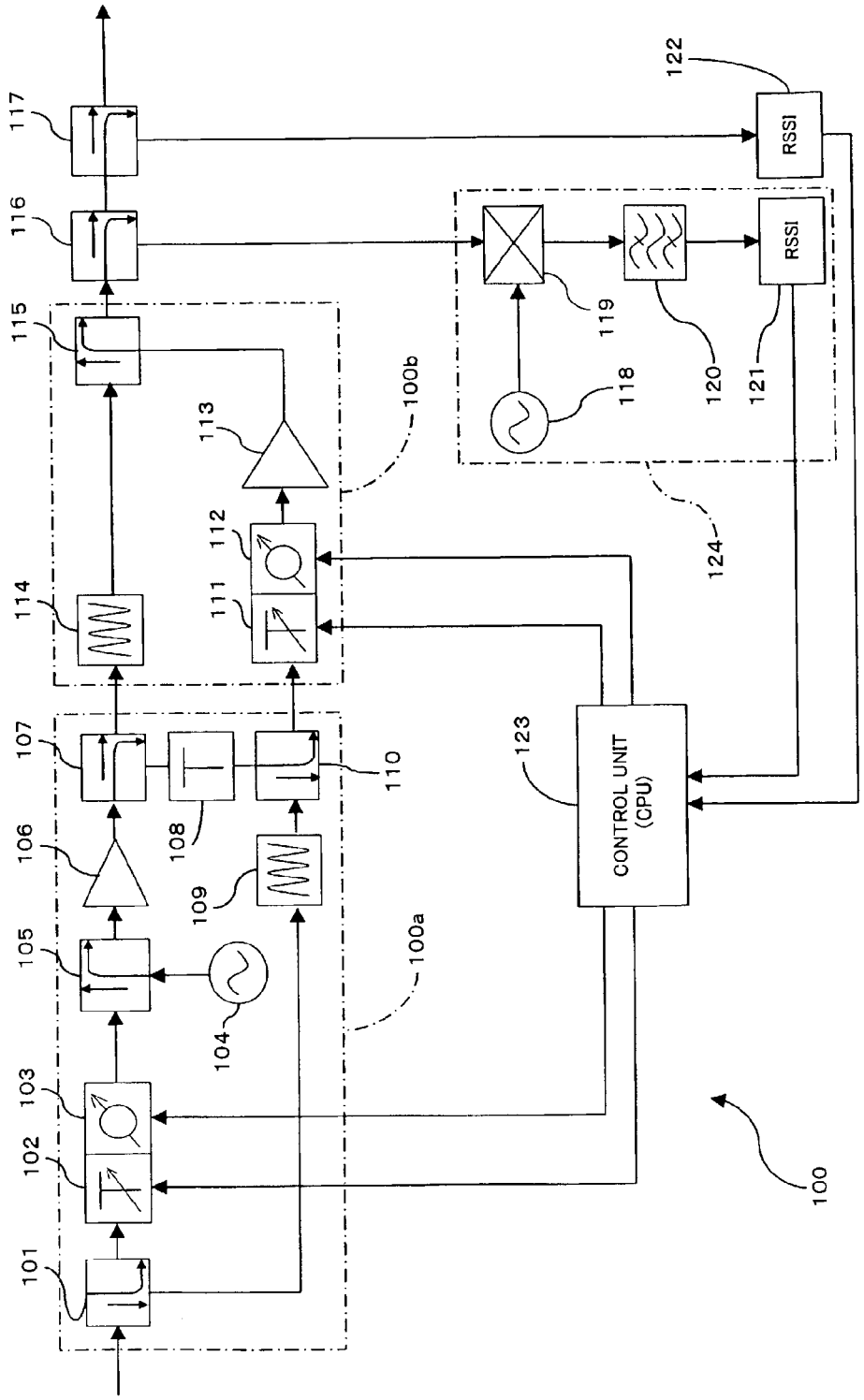
FIG. 4 is a block diagram showing an example of known mutlicarrier feed-forward amplifiers.

According to this embodiment, the main signal canceling unit (distortion extracting unit) 3 cancels a distortion component caused by intermodulation distortion and the like generated in a main signal after being amplified by a main signal amplifier 36 to be described later in the main signal before being amplified, thereby to extract it, as well. For this purpose, the main signal canceling unit 3 has a structure similar to that having been described above with reference to FIG. 4. In other words, the main signal canceling unit 3 comprises a first branch circuit 31, a variable attenuator 32, a first variable phase shifter 33, a pilot oscillator 34, a first combining circuit 35, the main signal amplifier (HPA: High Power Amplifier) 36, a second branch circuit 37, an attenuator 38, a first delay line 39 and a second combining circuit 40.

According to this embodiment, the first branch circuit 31 branches a part of an input main signal having a plurality of carriers, and outputs it acting as an auxiliary signal for canceling the main signal to the delay line 39, besides outputting the remaining input signal acting as a signal to be amplified by the main signal amplifier 36 to the variable attenuator 32, as well. The variable attenuator 32 and the variable phase shifter 33 invert the phase of the main signal and adjust the level of the same according to control information from the control unit 6 so that the main signal from the above first branch circuit 31 is combined at the same level as the above auxiliary signal and in the opposite phase to that of the auxiliary signal in the second combining circuit 40.

In a carrier detection mode of measuring a carrier power, the operations of the variable attenuator 32 and the variable phase shifter 33 according to this embodiment are stopped by the control unit 6 together with the variable attenuator 41 and the variable phase shifter 42 in the distortion canceling unit 4, and fixed to optimum values at the time of a normal state (pilot detection mode), as will be described later.

The pilot oscillator 34 generates a pilot signal having a predetermined frequency $f_p$. The first combining circuit 35 combines the main signal whose phase and level have been adjusted and the pilot signal from the pilot oscillator 104, thereby to add the pilot signal to the main signal. The pilot oscillator 34 and the combining circuit 35 together configure a pilot signal adding means for adding the pilot signal to the main signal, a result of power detection on the above pilot signal is going to be used in a distortion compensation control on an output (amplified output) of the main signal amplifier 36.

The main signal amplifier (HPA (High Power Amplifier); amplifying means) 36 amplifies the main signal to which the pilot signal has been added as above, in common with all the carriers (collectively). The second branch circuit 37 branches an output of the main signal amplifier 36 into two signals. One of the signals is outputted as an output of the multicarrier amplifier, and the other is outputted as a signal to be combined with the above auxiliary signal. The attenuator 38 attenuates the level of a signal from the above branch circuit 37 to a level of the signal before being amplified by the main signal amplifier 36.

The second combining circuit 40 combines a signal (whose phase has been inverted by the variable phase shifter 32) from the attenuator 38 and the above auxiliary signal (main signal whose phase is not inverted) taken out by the first branch circuit 31, thereby to cancel a main signal component in an output of the second branch circuit 37. As a result, only a distortion component generated in the output (main signal) of the main signal amplifier 36 is detected (extracted). The delay line 39 delays the above auxiliary signal by a predetermined time so that a timing of the auxiliary signal and a timing of the signal from the second branch circuit 37 are matched in the second combining circuit 40 when they are combined.

The distortion canceling unit 4 removes a distortion component from an output of the main signal amplifier 36 using the distortion component of the main signal extracted as above, like that having been described above with reference to FIG. 4. For this purpose, the distortion canceling unit 4 comprises a variable attenuator 41, a second variable phase shifter 42, an auxiliary amplifier 43, a second delay line 44 and a third combining circuit 45 similar to those having been described above with reference to FIG. 4.

Namely, the variable attenuator 41 and the variable phase shifter 42 adjust the level and phase of the distortion component detected by the main signal canceling unit 3 (combining circuit 40) as above according to a control by the control unit 6 in order to cancel a distortion component generated in an output of the main signal amplifier 36 using the distortion component. The auxiliary amplifier (distortion signal amplifier) 43 amplifies the gain of the distortion component whose level and phase have been adjusted as above to obtain a gain necessary to cancel the distortion in the main signal in the third combining circuit 45.

The third combining circuit 45 combines an output of the main signal amplifier 36 and an output of the auxiliary amplifier 43 to cancel a distortion component generated in an output of the main signal amplifier 36.

With the above structure, a distortion compensation control on an amplified output similar to the known control in the main signal canceling unit 100a and the distortion canceling unit 100b is possible even in the main signal canceling unit 3 and the distortion canceling unit 4 according to this embodiment.

In the main signal canceling unit 3, the second combining circuit 40 combines the output (main signal after being amplified) of the main signal amplifier 36 and the auxiliary signal (main signal before being amplified) taken out by the first branch circuit 31 at the same level and in the opposite phases, thereby to cancel a main signal component in the output of the main signal amplifier 36 and extract a distortion component. In the distortion canceling unit 4, the combining circuit 45 combines an output of the main signal amplifier 36 and the distortion component extracted as above at the same level and in the opposite phases, thereby to cancel the distortion component generated in the main signal after being amplified.

In FIG. 1, the power detecting unit 5 of a variable frequency type can detect a power of an output of the main signal amplifier 36 at an arbitrary detection frequency. For this purpose, the power detecting unit 5 of a variable frequency type comprises a third branch circuit 51, a local oscillator 52 of a variable frequency type, a frequency converter 53, a band-pass filter (BPS) 54 and a received signal strength indicator (RSSI) 55.

The third branch circuit 51 branches a part of an output of the distortion canceling unit 4, that is, the main signal after being amplified by the main signal amplifier 36. The branched signal is inputted to the frequency converter 5. The local oscillator 52 can output arbitrary frequencies in a frequency band including a frequency (pilot detection frequency) for detecting a pilot and a frequency (carrier detection frequency) for detecting a carrier, each acting as an oscillated frequency ($f_{LO}$), according to a control of the control unit 6.

Figure 2:
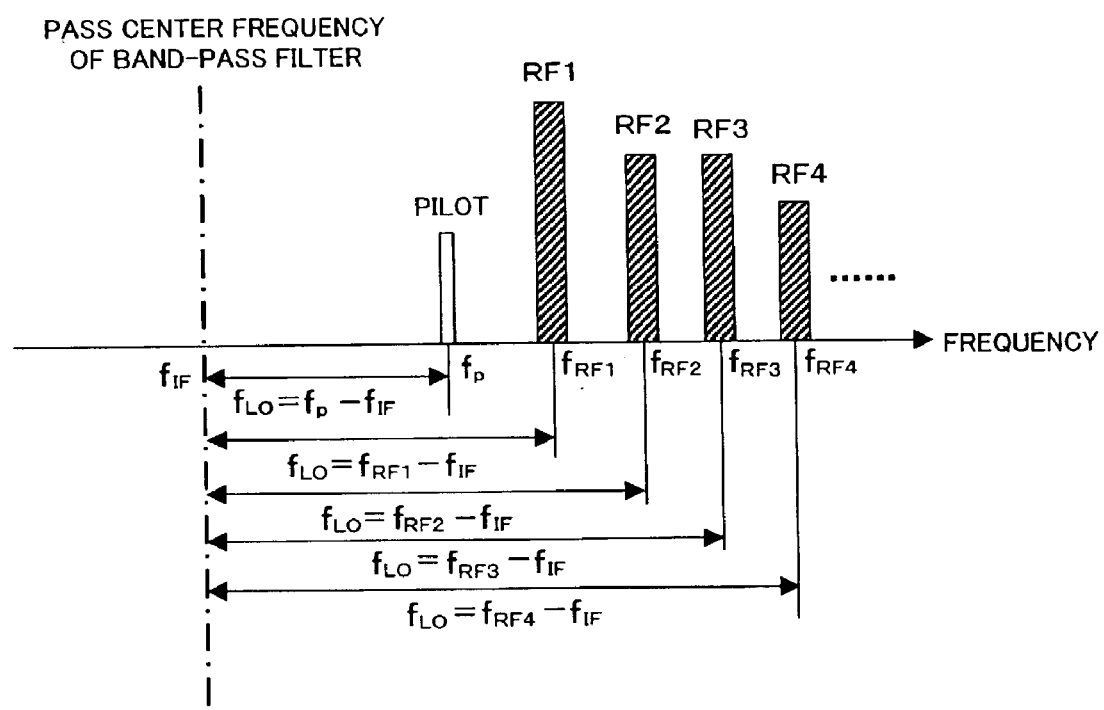
FIG. 2 is a schematic diagram illustrating an example of a spectrum of a multicarrier signal and a detecting operation according to the embodiment.

The frequency converter 53 converts (detects) the frequency of a part of the main signal branched by the above branch circuit 51 using an output ($f_{LO}$) of the local oscillator 52. The oscillated frequency ($f_{LO}$) of the local oscillator 52 is set as schematically shown in FIG. 2, for example, whereby a pilot frequency component ($f_p$) or a frequency component of one wave ($f_{FRi}$; where i is any one of 1 through n) is outputted in a state in which it is positioned at the pass center frequency ($f_{IF}$; 450 kHz, for example) of the band-pass filter in the following stage. Thus, only the pilot signal component or the carrier component passes through the band-pass filter 54.

The received signal strength indicator (received power detecting unit) 55 detects a received field strength of a signal having passed through the band-pass filter, that is, the pilot signal or the carrier (one wave), thereby detecting a power level of the signal.

Namely, the frequency converter 53, the band-pass filter 54 and the received signal strength indicator 55 described above together function as a power detecting circuit 56 common to the pilot signal and the carriers, which detects a power of the amplified output using an output of the local oscillator 52. In other words, the power detecting unit 5 of a variable frequency according to this embodiment is provided by improving the existing pilot power detecting unit 124 (refer to FIG. 4) exclusive to a pilot signal, so that the power detecting unit 5 of a variable frequency type can cope with individual carrier frequency to detect a power of each signal with a power detecting circuit common to the pilot signal and the carriers.

The control unit 6 controls operations of the main signal canceling unit 3, the distortion canceling unit 4 and the power detecting unit 5 of a variable frequency type on the basis of an output of the above received signal strength indicator 55, the control unit 6 being configured with a CPU (Central Processing Unit), for example. When focusing on its essential structure, the control unit 6 has the following functional blocks:

(1) a detection frequency control block 61 which controls the oscillated frequency of the local oscillator 52 to a carrier detection frequency corresponding to a target carrier frequency, a power of which is to be measured, in a carrier detection mode of measuring a power level of one carrier wave, and controls the oscillated frequency of the local oscillator 52 to a pilot detection frequency for detecting the pilot signal in a pilot detection mode of measuring a power level of the pilot signal;

(2) a distortion compensation control block 62 which controls the degree of attenuation and the quantity of phase rotation of the variable attenuator 32 and the variable phase shifter 33 on the basis of a pilot power (a result of power detection) detected by the received signal strength indicator 55 so that the main signal is best canceled in the combining circuit 40 in the main signal canceling unit 3 in the pilot detection mode, and controls the degree of attenuation and the quantity of phase rotation of the variable attenuator 41 and the variable phase shifter 42 so that the distortion component is best canceled in the main signal in the combining circuit 45 in the distortion canceling unit 4, thereby controlling the distortion compensation control on the amplified output to the optimum state;

(3) a repetition control block 63 which controls the detection frequency control block 61 when power levels of a plurality of carriers are measured so that the above carrier detection mode is repetitively executed a required number of times (that is, the carrier whose power is to be measured is changed each time);

(4) an over-output protection control block 64 which determines a total (carrier total power level) of powers of carriers obtained under a control of the repetition control block 63 in an arithmetic operation, monitors (judges) whether the carrier total power level exceeds a predetermined over-output threshold value or not, and executes power supply disconnection (shut-down control) to protect the device when the carrier total power level exceeds it.

In other words, the over-output protection control block 64 functions as an over-output state control unit which determines a total of results of power detection on all carrier signals obtained by repetitively executing the above carrier detection mode on all carrier signals, and judges and controls the over-output state of the amplified output on the basis of the total.

The centralized management system (carrier power level control unit) 7 communicates with the control unit 6 in the carrier detection mode to obtain a carrier power detection value of one wave notified to the control unit 6 from the received signal strength indicator 55, determines an output power level of a relevant carrier generated by the carrier generating unit 2 from the carrier power detection value, and adjusts the degree of attenuation of a corresponding attenuator 22-i according to it so as to adjust the output power level of the relevant carrier to a specified power level.

Namely, the control unit 6 and the centralized management system 7 together function as a controlling means 8 for controlling a detection frequency obtained in the power detection unit 5 of a variable frequency type to a carrier detection frequency corresponding to a carrier frequency whose power is to be measured, and controlling the power level of the carrier on the basis of a result of power detection obtained by the power detecting unit 5 of a variable frequency type.

Hereinafter, detailed description will be made of an operation of the multicarrier amplifier 1 with the above structure according to this embodiment.

In normal operation, the control unit 6 selects "the pilot detection mode", and the detection frequency control block 61 sets the oscillated frequency of the local oscillator 52 to the pilot detection frequency. Assuming that the oscillated frequency of the local oscillator 52 is $f_{LO}$, the pilot frequency is $f_p$, an IF frequency desired to be outputted from the frequency converter 53 is $f_{IF}$ (450 kHz, for example), the detection frequency control block 61 sets the oscillated frequency $f_{LO}$ of the local oscillator 52 to $f_{LO}=f_p\pm f_{IF}$ (450 kHZ).

Whereby, the multicarrier amplifier 1 operates as before. Namely, an IF signal at 450 kHz corresponding to the pilot frequency is extracted by the frequency converter 53 and the band-pass filter 54, power detection on the IF signal (pilot frequency component) is performed in the received signal strength indicator 55, and a pilot power detection value is obtained.

This pilot power detection value is notified to the control unit 6. The distortion compensation control unit 61 of the control unit 6 controls the degree of attenuation and the quantity of phase rotation of the variable attenuator 32 and the variable phase shifter 33 in the main signal canceling unit 3, and controls the degree of attenuation and the quantity of phase rotation of the variable attenuator 41 and the variable phase shifter 42 in the distortion canceling unit 4, thereby controlling the distortion compensation control on the amplified output to the optimum state.

Figure 3:
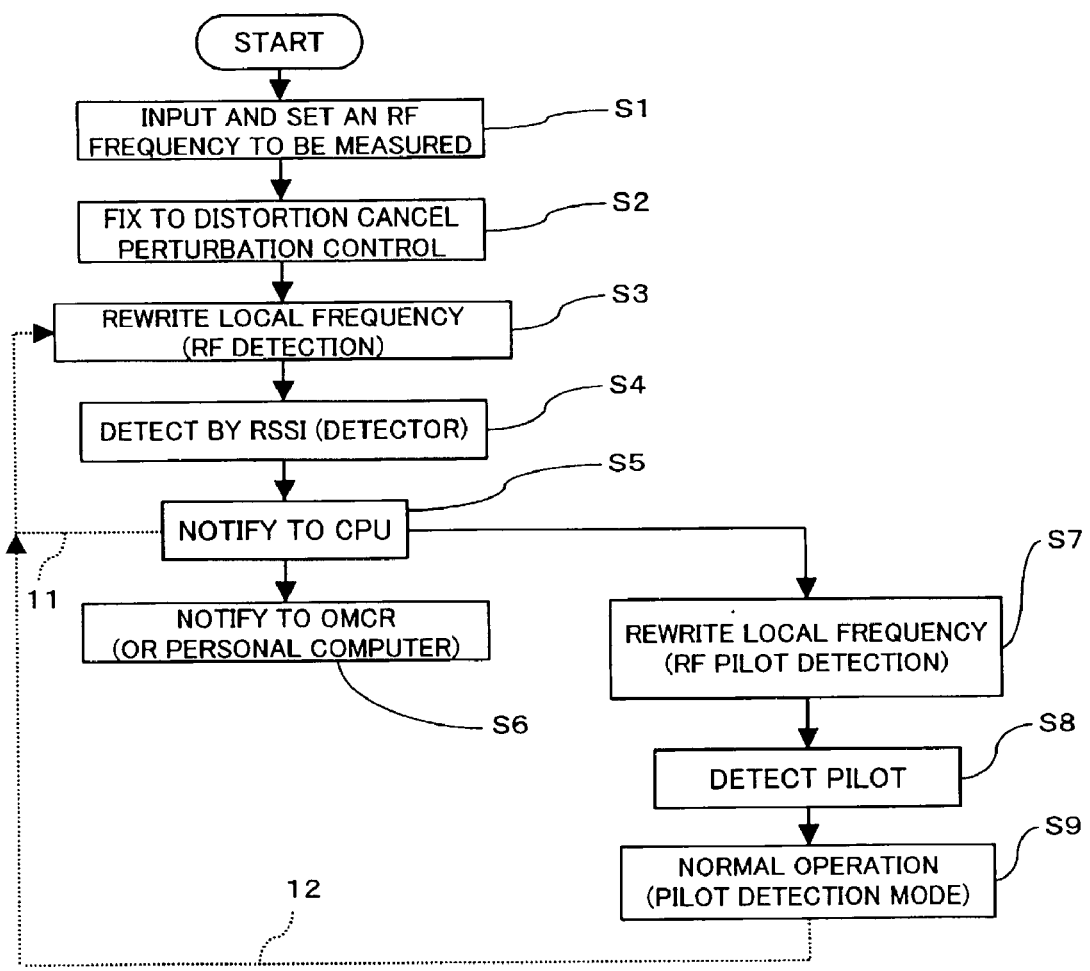
FIG. 3 is a flowchart for illustrating an operation of the mutlicarrier feed-forward amplifier shown in FIG. 1.

When the carrier power level of one carrier is measured, for example, an operation according to a flowchart (steps S1 through S9) shown in FIG. 3 is executed. Incidentally, step numbers such as S1, S2 and the like shown in FIG. 1 correspond to step numbers shown in FIG. 3.

In this case, a person who maintains the device or the like inputs frequency information on a carrier to be measured to the control unit 6 through the centralized management system 7 (step S1). The control unit 6 selects "the carrier detection mode". Whereby, the distortion control block 62 temporarily stops controls on the main signal canceling unit 3 and the distortion canceling unit 4 (variable attenuators 32 and 41, and variable phase shifters 33 and 42), and fixes the degree of attenuation and the quantity of phase rotation of the main signal to optimum values at the time of normal operation (step S2). The detection frequency control block 61 sets the oscillated frequency $f_{LO}$ of the local oscillator 52 to a frequency (carrier detection frequency) at which a carrier to be measured can be detected on the basis of the frequency information received from the centralized management system 7. Assuming that the carrier frequency to be measured is $f_{Ri}$, the oscillated frequency $f_{LO}$ of the local oscillator 52 is set to $f_{LO}=f_{Ri}\pm f_{IF}$ (450 kHz) (step S3).

As a result, only an IF signal at 450 kHz corresponding to a carrier frequency component ($f_{Ri}$) to be measured passes through the band-pass filter 54, and the power detecting unit 5 of a variable frequency type detects a power of the IF signal (carrier to be measured) (step S4). The received signal strength indicator 55 obtains a carrier power detection value, and the value is notified to the centralized management system 7 through the control unit 6 (steps S5 and S6).

The centralized management system 7 determines an output power level of the relevant carrier from the carrier power detection value notified as above, and adjusts the degree of attenuation of a corresponding variable attenuator 22-$i$ in the carrier generating unit 2 on the basis of it so that the relevant output power level becomes a specified power level.

As above, carrier power level measurement and adjustment on one wave is completed. Incidentally, a process for this carrier power level measurement and adjustment is completed within about several seconds, so that no problem occurs in the operation even if the distortion compensation control by pilot detection is temporarily stopped during the process.

After the above process for measurement and adjustment is completed, the control unit 6 selects "the pilot detection mode". The detection frequency control block 61 sets the oscillated frequency of the local oscillator 52 to the original frequency (pilot detection frequency) (step S7). The distortion cancel perturbation control by the distortion compensation control block 62, which has been temporarily stopped, is resumed (step S8). Whereby, the power detecting unit 5 of a variable frequency type detects the pilot signal (detects the power) (step S9), and the multicarrier amplifier 1 returns to the normal operation (step S10).

The multicarrier amplifier 1 according to this embodiment changes the oscillated frequency of the local oscillator 52 according to a carrier frequency, a power of which is to be measured, to recognize the power level of each of the carriers amplified in common, thereby automatically adjusting the power level of each carrier. Even when the number of carriers is increased in a mobile communication base station during operation of services (the carriers increased in order to solve shortage of channels, for example), it is possible to automatically set the transmission power level of an added carrier to a specified power level without stopping the services (operation) and without using an expensive spectrum analyzer or the like. Accordingly, the present invention provides a great merit in the operation, and is helpful to reduce the labor for maintaining and checking works.

Since the multicarrier amplifier 100 according to this invention recognizes a power level of each carrier and automatically controls it, it is possible to readily absorb variations in frequency characteristic of the transmitting circuits 22-1 through 22-$n$, and the main signal amplifier 36. Further, the multicarrier amplifier 100 according to this invention can recognize a power level of each carrier, it is possible to determine occurrence of failure, that is, which carrier does not reach the specified power level, for example, in the previous stage of the main signal amplifier 36, and automatically restore the failure by the above automatic power level adjustment.

According to this embodiment, the oscillated frequency of the local oscillator 52 is changed according to a signal (carrier or pilot signal) a power of which is to be measured. It is thereby possible to perform power detection of each carrier and power detection of the pilot signal in the common power detecting circuit 56, and largely reduce the size of the device (circuit) of the multicarrier amplifier 1 to realize a small-sized device.

When the power of each of plural or all carriers is measured, information (power detection value) on one carrier is notified to the control unit 6 (refer to a route 11 denoted by broken line with an arrow in FIG. 3), or the multicarrier amplifier 1 once shifts to the normal operation (pilot detection mode) (refer to a route 12 denoted by broken line with an arrow in FIG. 3), after that, an operation of changing the oscillated frequency of the local oscillator 52 is repeated a required number of times. This control is carried out by the above repetition control block 63.

Namely, the oscillated frequency of the local oscillator 52 is successively changed in the carrier detection mode, or the carrier detection mode and the pilot detection mode are alternately performed to change the oscillated frequency of the local oscillator 52 each time the carrier detection mode is performed, whereby the powers of plural or all carriers can be measured. When the oscillated frequency of the local oscillator 52 is successively changed in the carrier detection mode, the distortion compensation control based on a result of pilot detection is stopped during the above operation. For this, the latter control is more desirable.

Under the above repetitive control, powers of all carriers are stored in the control unit 6 and a total of them is determined, for example, whereby detection (determination) of over-output of the amplified output is possible. When the level of the carrier total power exceeds a predetermined over-output threshold value, the over-output protection control block 64 can perform a power supply disconnection (shut-down) control as before in order to protect the device. Accordingly, it is possible to secure the safety of the multicarrier amplifier 1 while largely reducing the size of the device.

According to this embodiment, total power detection, which is heretofore performed by the exclusive received signal strength indicator 122, is performed by the power detecting unit 5 of a variable frequency type (power detecting circuit 56), so that the known received signal strength indicator 122 becomes unnecessary, and the size of the multicarrier amplifier 1 can be more reduced.

If the above power measurement-adjustment control is performed on all carriers, periodically or at a desirable time (refer to a route 13 denoted by broken line with an arrow in FIG. 1), it becomes possible to automatically absorb an effect of a change in characteristic due to deterioration with age.

Note that the present invention is not limited to the above examples, but may be modified in various ways without departing from the scope of the invention.

Industrial Applicability

According to this invention, the detection frequency is changed according to a carrier frequency, a power of which is to be measured, in an amplifier which collectively amplifies multicarrier signals, whereby the power level of each carrier can be detected and automatically adjusted. It is thus possible to largely reduce human work such as a maintaining and checking work. Usefulness of this invention is extremely large.

What is claimed is:

1. A multicarrier amplifying device comprising:
   an amplifying means for amplifying a main signal having a plurality of carrier signals at frequencies differing from one another;
   a power detecting means of a variable frequency type being able to detect a power of an output of said amplifying means at an arbitrary detection frequency; and
   a controlling means for controlling said detection frequency in said power detecting means to a carrier detection frequency corresponding to a target carrier frequency, a power of which is to be measured, and controlling a power level of said carrier signal on the basis of a result of power detection by said power detecting means.

2. The multicarrier amplifying device according to claim 1 further comprising:
   a pilot signal adding means for adding a pilot signal, a result of power detection on which is to be used in a distortion compensation control on an amplified output of said amplifying means, to said main signal;
   wherein said power detecting means comprises:
      an oscillator of a variable frequency type;
      a power detecting circuit common to said pilot signal and said carrier signals for detecting a power of said amplified output using an output of said oscillator;
   said controlling means comprises:
      a detection frequency control unit for controlling an oscillated frequency of said oscillator to a carrier detection frequency corresponding to said target carrier frequency under a carrier detection mode, and controlling said oscillated frequency of said oscillator to a pilot detection frequency for pilot signal detection under a pilot detection mode;
      a distortion compensation control unit for performing said distortion compensation control on the basis of a result of power detection obtained by said power detecting circuit under said pilot detection mode; and
      a carrier power level control unit for controlling a power level of said carrier signal on the basis of a result of power detection obtained by said power detecting circuit under said carrier detection mode.

3. The multicarrier amplifying device according to claim 2, wherein said controlling means further comprises:
   an over-output state control unit for determining a total of results of power detection on all carrier signals obtained by repetitively executing said carrier detection mode on the all carrier signals, and determining and controlling an over-output state of said amplified output on the basis of said total.

* * * * *